United States Patent
Konishi et al.

(10) Patent No.: US 9,419,235 B2
(45) Date of Patent: Aug. 16, 2016

(54) METHOD FOR PRODUCING GEL CONTAINING NANO-CARBON MATERIAL

(75) Inventors: Toshifumi Konishi, Tokyo (JP); Takayuki Mochizuki, Tokyo (JP); Koichiro Matsui, Tokyo (JP)

(73) Assignee: SHIBAURA INSTITUTE OF TECHNOLOGY, Tokyo (JP)

(*) Notice: Subject to any disclaimer, the term of this patent is extended or adjusted under 35 U.S.C. 154(b) by 733 days.

(21) Appl. No.: 13/505,804

(22) PCT Filed: Nov. 5, 2010

(86) PCT No.: PCT/JP2010/069666
§ 371 (c)(1),
(2), (4) Date: May 3, 2012

(87) PCT Pub. No.: WO2011/055776
PCT Pub. Date: May 12, 2011

(65) Prior Publication Data
US 2012/0228558 A1    Sep. 13, 2012

(30) Foreign Application Priority Data

Nov. 6, 2009   (JP) .................. 2009-255135

(51) Int. Cl.
*H01B 1/04*   (2006.01)
*C01B 31/02*   (2006.01)
(Continued)

(52) U.S. Cl.
CPC ............... *H01L 51/444* (2013.01); *B82Y 10/00* (2013.01); *B82Y 30/00* (2013.01); *B82Y 40/00* (2013.01);
(Continued)

(58) Field of Classification Search
CPC ........ B82Y 10/00; B82Y 20/00; B82Y 30/00; B82Y 40/00; H01B 1/02–1/24
USPC ............. 252/500, 506, 510; 423/445 R, 448, 423/449.1, 460, 445 B; 977/842
See application file for complete search history.

(56) References Cited

U.S. PATENT DOCUMENTS

2003/0077515 A1* 4/2003 Chen et al. ................. 429/231.8
2006/0099135 A1* 5/2006 Yodh et al. ................. 423/447.1
(Continued)

FOREIGN PATENT DOCUMENTS

JP         3676337 B2    7/2005
WO    WO 2005/110594 A1   11/2005
(Continued)

OTHER PUBLICATIONS

Samanta et al. ("Carbon nanotube reinforced supramolecular gels with electrically conducting, viscoelastic and near-infrared sensitive properties." JMatChem, 20, pp. 6881-6890, online Jul. 12, 2010).*
(Continued)

*Primary Examiner* — Tri V Nguyen
(74) *Attorney, Agent, or Firm* — Kratz, Quintos & Hanson, LLP

(57) ABSTRACT

An object of the present invention is to provide a method for producing a gel containing a nano-carbon material, which allows the gelling medium used to be selected from a wide range of substances, is applicable to other nano-carbon materials in addition to carbon nanotubes, and can be implemented in an extremely simple manner. A method for producing a gel containing a nano-carbon material of the present invention as a means for achieving the object is characterized in that a nano-carbon material is stir-mixed with a gelling medium that satisfies the following conditions (but is not an ionic liquid), the gelling medium being in a liquid or molten state:
(1) the gelling medium is in a liquid state at ambient temperature or melts when heated; and
(2) the gelling medium contains, in the molecule, two or more rings of at least one kind selected from optionally substituted aromatic hydrocarbon monocyclic ring and optionally substituted aromatic heteromonocyclic ring.

8 Claims, 3 Drawing Sheets

(51) Int. Cl.
  *B82Y 40/00* (2011.01)
  *H01L 51/44* (2006.01)
  *B82Y 10/00* (2011.01)
  *B82Y 30/00* (2011.01)
  *H01B 1/24* (2006.01)
  *H01G 9/20* (2006.01)
  *H01L 51/00* (2006.01)

(52) U.S. Cl.
  CPC ......... *C01B 31/0206* (2013.01); *C01B 31/0253* (2013.01); *H01B 1/24* (2013.01); *H01G 9/20* (2013.01); *H01L 51/0048* (2013.01); *H01L 51/0054* (2013.01); *Y02E 10/549* (2013.01); *Y02P 70/521* (2015.11)

(56) References Cited

U.S. PATENT DOCUMENTS

| | | | |
|---|---|---|---|
| 2007/0196401 A1* | 8/2007 | Naruse et al. | 424/401 |
| 2008/0210907 A1* | 9/2008 | Yoshida | B82Y 30/00 252/301.36 |
| 2011/0024698 A1* | 2/2011 | Worsley et al. | 252/511 |
| 2011/0124790 A1* | 5/2011 | Penicaud | 524/424 |
| 2011/0233452 A1* | 9/2011 | Kim et al. | 252/62.54 |

FOREIGN PATENT DOCUMENTS

| | | | | |
|---|---|---|---|---|
| WO | WO 2007/052739 A1 | 5/2007 | | |
| WO | WO 2008048352 A2 * | 4/2008 | | B01J 20/22 |
| WO | WO 2009101271 A2 * | 8/2009 | | C01B 31/30 |

OTHER PUBLICATIONS

Chen NPL ("A new method for the preparation of stable carbon nanotube organogels." Carbon, 44, pp. 2142-2146, Apr. 18, 2006).*

Nagarajan et al. ("A sugar—pyrene-based fluorescent gelator: nanotubular architecture and interaction with SWCNTs." New J. of Chem, 33, pp. 2391-2396, online Oct. 30, 2009).*

International Search Report for International Application No. PCT/JP2010/069666 dated Dec. 21, 2010.

* cited by examiner

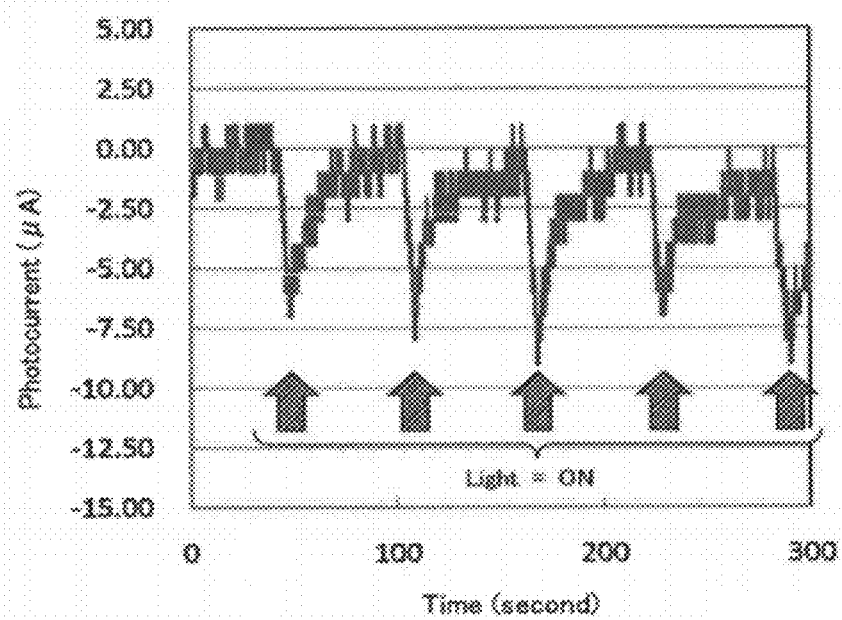

METHOD FOR PRODUCING GEL CONTAINING NANO-CARBON MATERIAL

TECHNICAL FIELD

The present invention relates to a method for producing a gel containing a nano-carbon material such as carbon nanotubes.

BACKGROUND ART

As is well known, carbon nanotubes are expected to be applied in various fields, including the field of electronics, as next-generation carbon materials having excellent characteristics in terms of electrical conductivity, thermal conductivity, mechanical strength, etc. However, carbon nanotubes easily and irreversibly aggregate (into bundles) due to the van der Waals force, for example, resulting in deteriorated characteristics and reduced workability, and this has been an obstacle to practical use. Methods for solving this problem have been intensively studied and developed. The point of solving the problem is how to deal with $\pi$-$\pi$ interactions between carbon nanotubes induced by the $\pi$-surface of carbon nanotubes, which could be the factor that causes aggregation. Therefore, a method in which the surface of carbon nanotubes is chemically treated to modify the $\pi$-surface has been proposed. However, this method has a problem in that the chemical treatment on the surface of carbon nanotubes deteriorates the original characteristics of the carbon nanotubes. Further, as a different method, a method in which a surfactant having high affinity to the surface of carbon nanotubes, for example, is added as a dispersant to a solvent (an aqueous solvent, an organic solvent, etc.) together with carbon nanotubes, so that the dispersant molecules are located between carbon nanotubes in the solvent, thereby reducing or blocking $\pi$-$\pi$ interactions between carbon nanotubes, has been proposed. This method is advantageous in that carbon nanotubes can be dispersed in a solvent without deteriorating their original characteristics. However, equilibrium is established in the association between carbon nanotubes and a dispersant, and their association is thus a dynamic, reversible phenomenon, while the association of carbon nanotubes (i.e., aggregation) is followed by precipitation and thus is a dynamic, irreversible phenomenon. Therefore, although the association of carbon nanotubes can be temporarily inhibited by the coexistence of carbon nanotubes with a dispersant in a solvent, the association of carbon nanotubes cannot be completely stopped. Accordingly, there is a problem in that carbon nanotubes reaggregate with time. Further, because carbon nanotubes are dispersed in a solvent, at the time of processing, there is a problem of how to handle the solvent. There also is a problem in that carbon nanotubes reaggregate during the handling of the solvent.

In recent years, as a novel method free from the problems that the above methods have, Patent Document 1 has proposed a method in which a shearing force is applied to carbon nanotubes for deagglomeration in the presence of an ionic liquid (a salt that is in a molten state at ambient temperature, which is also referred to as "ambient temperature molten salt" or simply as "molten salt"), thereby giving a gel containing carbon nanotubes. This method can be implemented in a simple manner such that carbon nanotubes and an ionic liquid are mixed and ground in a mortar. Also, carbon nanotubes are dispersed in a gel, and, because it is a gel, high workability is achieved. Accordingly, this method has been valued as an extremely useful method. However, as stated in Patent Document 1, to this method, the following three factors are indispensable: 1. in the presence of an ionic liquid, 2. carbon nanotubes are, 3. subjected to a shearing force and thus deagglomerated. According to Patent Document 1, when even one of these factors is not met, no gel is obtained. Thus, this method is inferior in terms of versatility. Specifically, as long as the use of an ionic liquid as a gelling medium is indispensable, the gelling medium must be selected from limited substances. In addition, because ionic liquids have electrical conductivity, although this method is suitable for application in a field where a gel with electrical conductivity is advantageous, the method is unsuitable for application in a field where a gel without electrical conductivity has more advantages. Further, no gel can be obtained in the cases of nano-carbon materials other than carbon nanotubes, such as carbon nanofibers and graphene. Further, the operation of applying a shearing force to carbon nanotubes for deagglomeration can be easily performed on a laboratory scale; however, on an industrial scale, even though Patent Document 1 states that a wet-milling apparatus or a kneader-type mixer can be used, such an operation is not always easy.

PRIOR ART DOCUMENTS

Patent Documents

Patent Document 1: Japanese Patent No. 3676337

SUMMARY OF THE INVENTION

Problems that the Invention is to Solve

Thus, an object of the present invention is to provide a method for producing a gel containing a nano-carbon material, which allows the gelling medium used to be selected from a wide range of substances, is applicable to other nano-carbon materials in addition to carbon nanotubes, and can be implemented in an extremely simple manner.

Means for Solving the Problems

In light of the above points, the present inventors conducted extensive research. As a result, they totally unexpectedly found that the three factors that are regarded as indispensable to obtain a gel containing carbon nanotubes in the method of Patent Document 1 are not necessarily indispensable, and that a substance that is not in the form of a salt like an ionic liquid can also be a gelling medium. Then, they studied various substances for their gel-forming ability. As a result, it turned out that substances with gel-forming ability have the following points in common: they are substances that are in a liquid state at ambient temperature or melt when heated; and they are substances containing, in the molecule, two or more of benzene ring and/or aromatic heteromonocyclic ring (the benzene ring and/or the aromatic heteromonocyclic ring being optionally fused). It further turned out that gelation is caused by simply stir-mixing such a gel-forming substance, in a liquid or molten state, with carbon nanotubes, and that this phenomenon is not peculiar to carbon nanotubes, but also occurs to nano-carbon materials other than carbon nanotubes.

A method for producing a gel containing a nano-carbon material according to the present invention accomplished based on the above findings is, as defined in claim 1, characterized in that a nano-carbon material is stir-mixed with a gelling medium that satisfies the following conditions (but is not an ionic liquid), the gelling medium being in a liquid or molten state:

(1) the gelling medium is in a liquid state at ambient temperature or melts when heated; and (2) the gelling medium contains, in the molecule, two or more rings of at least one kind selected from optionally substituted aromatic hydrocarbon monocyclic ring and optionally substituted aromatic heteromonocyclic ring.

Further, a method as defined in claim 2 is characterized in that in the method according to claim 1, the nano-carbon material is carbon nanotubes.

Further, a method as defined in claim 3 is characterized in that in the method according to claim 1, the gelling medium contains at least one heteroatom in the molecule.

Further, a gel containing a nano-carbon material according to the present invention is, as defined in claim 4, characterized in that the gel is produced by stir-mixing a nano-carbon material with a gelling medium that has the following characteristics (but is not an ionic liquid), the gelling medium being in a liquid or molten state:

(1) the gelling medium is in a liquid state at ambient temperature or melts when heated; and (2) the gelling medium contains, in the molecule, two or more rings of at least one kind selected from optionally substituted aromatic hydrocarbon monocyclic ring and optionally substituted aromatic heteromonocyclic ring.

Effect of the Invention

The present invention enables the provision of a method for producing a gel containing a nano-carbon material, which allows the gelling medium used to be selected from a wide range of substances, is applicable to other nano-carbon materials in addition to carbon nanotubes, and can be implemented in an extremely simple manner.

BRIEF DESCRIPTION OF THE DRAWINGS

FIG. 5 is a graph showing the photoelectric conversion function of a gel obtained in the same manner as in Example 4.

MODE FOR CARRYING OUT THE INVENTION

Figure 1:
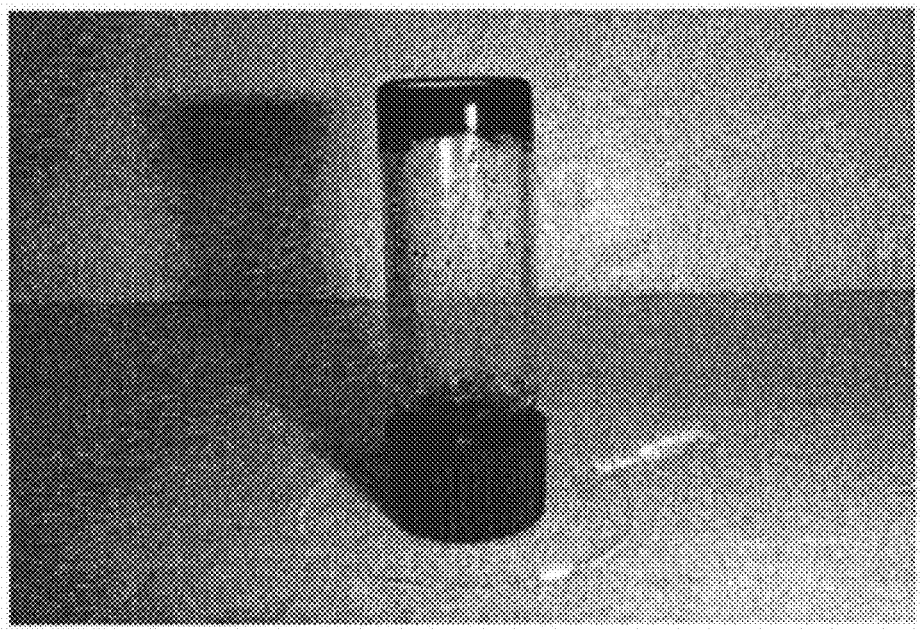
FIG. 1 is a photograph showing that the contents of a vial in Example 1 are a gel (black contents at the top of the inverted vial are the gel).

A method for producing a gel containing a nano-carbon material according to the present invention is characterized in that a nano-carbon material is stir-mixed with a gelling medium that satisfies the following conditions (but is not an ionic liquid), the gelling medium being in a liquid or molten state:

(1) the gelling medium is in a liquid state at ambient temperature or melts when heated; and (2) the gelling medium contains, in the molecule, two or more rings of at least one kind selected from optionally substituted aromatic hydrocarbon monocyclic ring and optionally substituted aromatic heteromonocyclic ring.

The details will be described hereinafter.

(Nano-Carbon Material)

As nano-carbon materials, to which the present invention is to be applied, carbon materials with a nanometer-scale size can be mentioned, such as carbon nanotubes, carbon nanofibers, graphite, graphene, carbon nanohorns, peapods, and fullerenes. The nanometer-scale size is a diameter for carbon nanotubes and a fiber diameter for carbon nanofibers. Carbon nanotubes may be single-wall carbon nanotubes (SWNTs) or multi-wall carbon nanotubes (MWNTs).

(Gelling Medium)

A gelling medium of the present invention is a substance that satisfies the following conditions (but is not an ionic liquid):

(1) the gelling medium is in a liquid state at ambient temperature or melts when heated; and (2) the gelling medium contains, in the molecule, two or more rings of at least one kind selected from optionally substituted aromatic hydrocarbon monocyclic ring and optionally substituted aromatic heteromonocyclic ring.

The condition (1) is the condition about the physicochemical properties required for the gelling medium of the present invention. The reason why it has to be in a liquid state at ambient temperature or melt when heated is that the gelling medium of the present invention has to be mix-stirred in a liquid or molten state with a nano-carbon material. Substances that are in a liquid state at ambient temperature or melt when heated include substances that are in a liquid state at ambient temperature, substances that are in a solid state at ambient temperature and converted into a molten state at a temperature equal to or higher than ambient temperature when heated, etc. Besides, ambient temperature herein refers to room temperature, for example. Specifically, a temperature of 15° C. to 25° C. is mentioned as an example. The degree of heating to convert a substance that turns into a molten state upon heating into a molten state depends on the melting point of the substance, and thus varies from one substance to another. However, in the light of the fact that the gelling medium of the present invention is an organic substance, the upper limit is usually 300° C.

The condition (2) is the condition about the chemical structure required for the gelling medium of the present invention. Regarding whether a substance can be the gelling medium of the present invention or not, it appears that the condition (1) and the condition (2) are not independent conditions that have no relevance to each other. However, a substance that satisfies the condition (1) but does not satisfy the condition (2), such as benzene, aniline, benzonitrile, pyridine, or ethyl alcohol, cannot be the gelling medium of the present invention.

An aromatic hydrocarbon monocyclic ring refers to a hydrocarbon monocyclic ring with aromaticity, and a typical example thereof is benzene. It may also be ionic, such as cyclopentadienyl anion or cycloheptatrienium ion with a six-π-electron structure. The aromatic hydrocarbon monocyclic ring preferably has 5 to 10 members. When the number of ring members is too small or too large, it is difficult to show effective interactions with a nano-carbon material, whereby the gel-forming ability deteriorates.

An aromatic heteromonocyclic ring refers to a heteromonocyclic ring with aromaticity, and may be any ring as long as it has at least one heteroatom such as a nitrogen atom, an oxygen atom, or a sulfur atom (in the case where two or more heteroatoms are contained, such heteroatoms may be the same or different). Specific examples thereof include pyrrole, imidazole, pyrazole, triazole, tetrazole, pyridine, pyrazine, pyrimidine, pyridazine, and triazine that are aromatic heteromonocyclic rings containing nitrogen atom(s); furan that is an aromatic heteromonocyclic ring containing an oxygen atom; thiophene that is an aromatic heteromonocyclic ring containing a sulfur atom; phosphole that is an aromatic heteromonocyclic ring containing a phosphorus atom; oxazole and isoxazole that are aromatic heteromonocyclic rings containing a nitrogen atom and an oxygen atom; and thiazole and isothiazole that are aromatic heteromonocyclic rings containing a nitrogen atom and a sulfur atom. The aromatic heteromonocyclic ring preferably has 5 to 10 members. When the number of ring members is too small or too large, it is difficult to show effective interactions with a nano-carbon material, whereby the gel-forming ability deteriorates.

With respect to aromatic hydrocarbon monocyclic ring and/or aromatic heteromonocyclic ring, of which the gelling medium of the present invention contains a total of two or more in the molecule, the forms of such ring present in the molecule are not particularly limited. They may be bonded together directly or through another atom (a carbon atom, a nitrogen atom, an oxygen atom, a sulfur atom, a phosphorus atom, etc.). Further, as monocyclic rings forming a fused ring, they may be fused together, or may also be bonded together directly or through another atom. Specific examples of fused rings are as follows.

A. Aromatic Hydrocarbon Fused Rings: 6-Membered Rings

Naphthalene, phenanthrene, pyrene, acenaphthene, acenaphthylene, anthracene, benzo[a]anthracene, benzo[a]pyrene, benzo[e]pyrene, benzo[b]fluoranthene, benzo[g,h,i]perylene, benzo[j]fluoranthene, benzo[k]fluoranthene, chrysene, dibenzo[a,h]anthracene, fluoranthene, fluorene, indeno[1,2,3-c,d]pyrene, tetracene, triphenylene, tetraphene, pentacene, picene, perylene B. Heteroatom-Containing Aromatic Fused Rings: 5-Membered Ring+6-Membered Ring Benzofuran, isobenzofuran, indole, isoindole, benzothiophene, benzo[c]thiophene, benzophosphole, benzimidazole, purine, indazole, benzoxazole, benzisoxazole, benzothiazole C. Heteroatom-Containing Aromatic Fused Rings: 6-Membered Ring+6-Membered Ring Quinoline, isoquinoline, quinoxaline, quinazoline, cinnoline, acridine D. Others For example, azulene formed by the fusion of cyclopentadienyl anion and cycloheptatrienium ion (5-membered ring+7-membered ring)

Substituents that the gelling medium of the present invention optionally has in the molecule are not particularly limited. Specific examples of substituents include lower alkyl groups ($C_{1-10}$ linear or branched alkyl groups, such as a methyl group, an ethyl group, an isopropyl group, and a t-butyl group), a trifluoromethyl group, lower alkoxy groups ($C_{1-10}$ linear or branched alkoxy groups, such as a methoxy group and an ethoxy group), halogens (such as chlorine), a nitro group, a hydroxy group, an amino group, mono(lower alkyl)amino groups (amino groups mono-substituted with a $C_{1-10}$ linear or branched alkyl group, such as a monomethylamino group), di(lower alkyl)amino groups (amino groups di-substituted with $C_{1-10}$ linear or branched alkyl groups, such as a dimethylamino group), tri(lower alkyl)silyl groups (silyl groups tri-substituted with $C_{1-10}$ linear or branched alkyl groups, such as a trimethylsilyl group), lower hydroxyalkyl groups ($C_{1-10}$ linear or branched hydroxyalkyl groups, such as a hydroxymethyl group and a hydroxyethyl group), lower alkoxycarbonyl groups (alkoxycarbonyl groups whose alkoxy moiety is $C_{1-10}$ linear or branched alkoxy, such as a methoxycarbonyl group and an ethoxycarbonyl group), a formyl group, a cyano group, a carbonyl group, a carbamoyl group, lower alkylcarbamoyl groups (alkylcarbamoyl groups whose alkyl moiety is $C_{1-10}$ linear or branched alkyl, such as a methylcarbamoyl group), lower alkylsulfonyl groups (alkylsulfonyl groups whose alkyl moiety is $C_{1-10}$ linear or branched alkyl, such as a methylsulfonyl group), arylsulfonyl groups (such as a phenylsulfonyl group), lower alkoxysulfonyl groups (alkoxysulfonyl groups whose alkoxy moiety is $C_{1-10}$ linear or branched alkoxy, such as a methoxysulfonyl group), a sulfamoyl group, lower alkylsulfamoyl groups (alkylsulfamoyl groups whose alkyl moiety is $C_{1-10}$ linear or branched alkyl, such as a methylsulfamoyl group), di(lower alkyl)phosphoryl groups (such as a dimethylphosphoryl group), di(lower alkoxy)phosphoryl groups (such as a dimethoxyphosphoryl group), and a diaminophosphoryl group.

Besides, for example, a method in which carbon nanotubes are dispersed in water using as a dispersant a pyrene derivative having ammonium ion introduced into the side chain is known in the art (Nakashima et al., Chem. Lett., 6, 638-639, 2002). Thus, a method for dispersing a nano-carbon material in a solvent (an aqueous solvent, an organic solvent, etc.) using as a dispersant a substance that can satisfy the condition (2) is known. However, in the method for producing a gel containing a nano-carbon material of the present invention, a gel is formed from a nano-carbon material and a gelling medium without using a solvent, and the gelling medium used does not have to be ionic (in the form a salt) (i.e., may be nonionic). Accordingly, the present invention is fundamentally different from the previously known method that disperses a nano-carbon material in a solvent.

(Stir-Mixing of Nano-Carbon Material with Gelling Medium)

As long as it is performed with the gelling medium being in a liquid or molten state, any method is possible. Specifically, manual or electric mixing using an agate mortar and a pestle, ultrasonic irradiation, stirring using a stirrer, stirring by shaking, high-speed vibration using a mill, and like mechanical techniques can be employed. Of special note is that a shearing force that is regarded as indispensable in the method of Patent Document 1 is not necessarily required. The proportions of a nano-carbon material and a gelling medium are preferably such that the nano-carbon material is 0.1% to 20% relative to the gelling medium, more preferably 0.5% to 10%, and still more preferably 1% to 5% (weight ratio). When the proportion of a nano-carbon material is too small relative to a gelling medium, the resulting gel has a low nano-carbon material content. Meanwhile, when the proportion is too large, the amount of the gelling medium is insufficient relative to the nano-carbon material, and, as a result, the gelling medium cannot sufficiently serve its function, whereby gelation is less likely to occur. Besides, when the proportion of a nano-carbon material is too small relative to a gelling medium, some of the gelling medium may not be incorporated into the gel and remain behind. In such a case, the remaining gelling medium may be separated from the gel by centrifugation.

The thus-produced gel containing a nano-carbon material of the present invention, because it is a gel, has high workability, and can be processed by various techniques, such as coating, injection, and extrusion. In the case where a substance that is in a solid state at ambient temperature and converted into a molten state at a temperature equal to or higher than ambient temperature when heated is used as a gelling medium, the resulting gel solidifies at ambient temperature. Therefore, such a gel can be solidified in the desired shape or at the desired place, and directly used as a shaped body containing a nano-carbon material. Further, in the case where a highly volatile substance is used as a gelling medium, for example, after the gel is applied to the surface of a substrate, the gelling medium is extracted from the gel under reduced pressure or atmospheric pressure; as a result, a structure made of a nano-carbon material can be formed on the surface of the substrate. In the case where a substance with electronic functionality is used as a gelling medium, the resulting gel can be used as an electronic functional material. In the case where a substance with polymerizability is used as a gelling medium, after a gel is obtained, the gelling medium can be polymerized to give a polymer containing a nano-carbon material. Thus, in the present invention, the gelling medium to be used can be selected from a wide range of substances with various properties, whereby the applications of nano-carbon materials are diversified. Further, in the production of a gel from a nano-carbon material and a gelling medium, when a functional material different from the nano-carbon material is added to the system, the resulting gel can be used as a composite material containing both. Therefore, according to the present invention, the applicability of nano-carbon materials can be expanded into fields and applications that have been heretofore unattainable.

EXAMPLES

Hereinafter, the present invention will be described in detail with reference to the examples, but the following descriptions are not to be construed as restrictive.

Example 1

289 mg of N,N-dimethyl-1-naphthylamine, which is in a liquid state at room temperature, was placed in a vial. While performing ultrasonic irradiation, 10 mg of SWNTs (manufactured by Carbon Nanotechnology, Inc.; the same hereinafter) (3.5 wt % relative to the former) was added thereto in small portions. As a result, when the addition was completed, the contents had gelled. The contents were identified as a gel based on the fact that the contents at the bottom of the vial were maintained upon vial inversion and also on the observation of appearance (FIG. 1).

Example 2

285 mg of N,N-dimethyl-2-naphthylamine, which is in a solid state at room temperature, was placed in an agate mortar warmed to 50° C. on a hot plate, and thus converted into a molten state. While mixing with a pestle, 10 mg of SWNTs (3.5 wt % relative to the former) was added thereto in small portions. As a result, when the addition was completed, the contents had gelled. The obtained gel was cooled to room temperature, whereby it solidified. The solid matter was placed in a vial, and then the vial was warmed to 50° C. on a hot plate. As a result, the contents gelled again (the contents were identified as a gel in the same manner as in Example 1).

Example 3

428 mg of 2-phenylpyridine, which is in a liquid state at room temperature, was placed in a vial. While performing ultrasonic irradiation, 8 mg of SWNTs (1.9 wt % relative to the former) was added thereto in small portions. As a result, when the addition was completed, the contents had gelled (the contents were identified as a gel in the same manner as in Example 1).

Example 4

331 mg of N-(2-ethylhexyl)carbazole, which is in a liquid state at room temperature, was placed in a vial. While performing ultrasonic irradiation, 8 mg of SWNTs (2.4 wt % relative to the former) was added thereto in small portions. As a result, when the addition was completed, the contents had gelled (the contents were identified as a gel in the same manner as in Example 1).

Example 5

331 mg of m, m'-ditolylamine, which is in a liquid state at room temperature, was placed in a vial. While performing ultrasonic irradiation, 14 mg of SWNTs (4.2 wt % relative to the former) was added thereto in small portions. As a result, when the addition was completed, the contents had gelled (the contents were identified as a gel in the same manner as in Example 1).

Example 6

378 mg of 9-ethylcarbazole, which is in a solid state at room temperature, was placed in an agate mortar warmed to 100° C. on a hot plate, and thus converted into a molten state. While mixing with a pestle, 7 mg of SWNTs (1.9 wt % relative to the former) was added thereto in small portions. As a result, when the addition was completed, the contents had gelled. The obtained gel was cooled to room temperature, whereby it solidified. The solid matter was placed in a vial, and then the vial was warmed to 100° C. on a hot plate. As a result, the contents gelled again (the contents were identified as a gel in the same manner as in Example 1).

Example 7

743 mg of 1,10-phenanthroline monohydrate, which is in a solid state at room temperature, was placed in an agate mortar warmed to 200° C. on a hot plate, and thus converted into a molten state. While mixing with a pestle, 16 mg of SWNTs (2.2 wt % relative to the former) was added thereto in small portions. As a result, when the addition was completed, the contents had gelled. The obtained gel was cooled to room temperature, whereby it solidified. The solid matter was placed in a vial, and then the vial was warmed to 200° C. on a hot plate. As a result, the contents gelled again (the contents were identified as a gel in the same manner as in Example 1).

Example 8

357 mg of 2-methylquinoline, which is in a liquid state at room temperature, was placed in a vial. While performing ultrasonic irradiation, 7 mg of SWNTs (2.0 wt % relative to the former) was added thereto in small portions. As a result, when the addition was completed, the contents had gelled (the contents were identified as a gel in the same manner as in Example 1).

Example 9

500 mg of phenanthrene, which is in a solid state at room temperature, was placed in a vial, then 20 mg of SWNTs (4.0 wt % relative to the former) was further added thereto, and the vial was warmed to 180° C. on a hot plate to convert the former into a molten state, followed by ultrasonic irradiation for 30 seconds. As a result, the contents gelled (the contents were identified as a gel in the same manner as in Example 1).

Example 10

500 mg of pyrene, which is in a solid state at room temperature, was placed in a vial, then 20 mg of SWNTs (4.0 wt % relative to the former) was further added thereto, and the vial was warmed to 180° C. on a hot plate to convert the former into a molten state, followed by ultrasonic irradiation for 30 seconds. As a result, the contents gelled (the contents were identified as a gel in the same manner as in Example 1).

Summary of Example 1 to Example 10 and Discussion

Table 1 shows the chemical structural formulae of the substances used as gelling media in Example 1 to Example 10 (all of them are known substances). As is obvious from Table 1, in the present invention, substances with a wide variety of chemical structures are usable as gelling media. In terms of chemical structure, what they have in common is that they contain, in the molecule, a total of two or more of aromatic hydrocarbon monocyclic ring and/or aromatic heteromonocyclic ring. In the case where N,N-dimethyl-1-naphthylamine used in Example 1 is replaced with benzene, aniline, benzonitrile, pyridine, or ethyl alcohol, and the same operation is performed, no gelation occurs. The reason why the substances used in Example 1 to Example 10 each function as the gelling medium of the present invention is not completely clear, but is presumed as follows. Once gelling medium molecules enter between carbon nanotubes, π-π interactions between the carbon nanotubes due to π-π interactions between the π-surfaces of the carbon nanotubes are reduced or blocked, and, as a result, carbon nanotubes are dispersed to form a three-dimensional network (carbon nanotube network), while the gelling medium molecules lose their fluidity in the space therein. Although eight out of ten substances used as gelling media contain a nitrogen atom(s) in the molecule (Example 1 to Example 8), to contain a nitrogen atom in the molecule is not an indispensable condition for the gelling medium of the present invention. However, it is believed that when the gelling medium of the present invention contains a nitrogen atom in the molecule, charge transfer (CT) interactions occur between the nitrogen lone pair and the π-surface of a carbon nanotube, thereby allowing, together with π-π interactions, carbon nanotubes to be more strongly dispersed. In light of this, in the present invention, it appears advantageous for the gelling medium of the present invention to contain a heteroatom such as a nitrogen atom in the molecule (an oxygen atom, a sulfur atom, a phosphorus atom, and the like can be mentioned in addition to a nitrogen atom).

TABLE 1

| Example No. | Gelling Medium |
| --- | --- |
| 1 | [structure] |
| 2 | [structure] |
| 3 | [structure] |

TABLE 1-continued

| Example No. | Gelling Medium |
| --- | --- |
| 4 | [structure] |
| 5 | [structure] |
| 6 | [structure] |
| 7 | [structure] · $H_2O$ |
| 8 | [structure] |
| 9 | [structure] |
| 10 | [structure] |

(Characteristics of Gel Using N-(2-Ethylhexyl)carbazole as Gelling Medium)

Figure 2:
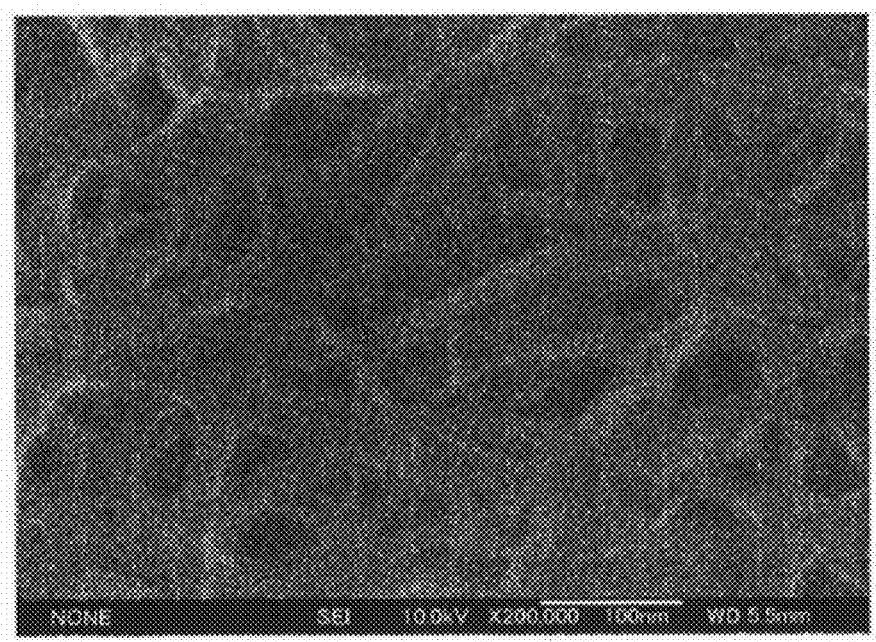
FIG. 2 is a SEM image showing carbon nanotubes forming a three-dimensional network in a gel obtained in Example 4.
Figure 3:
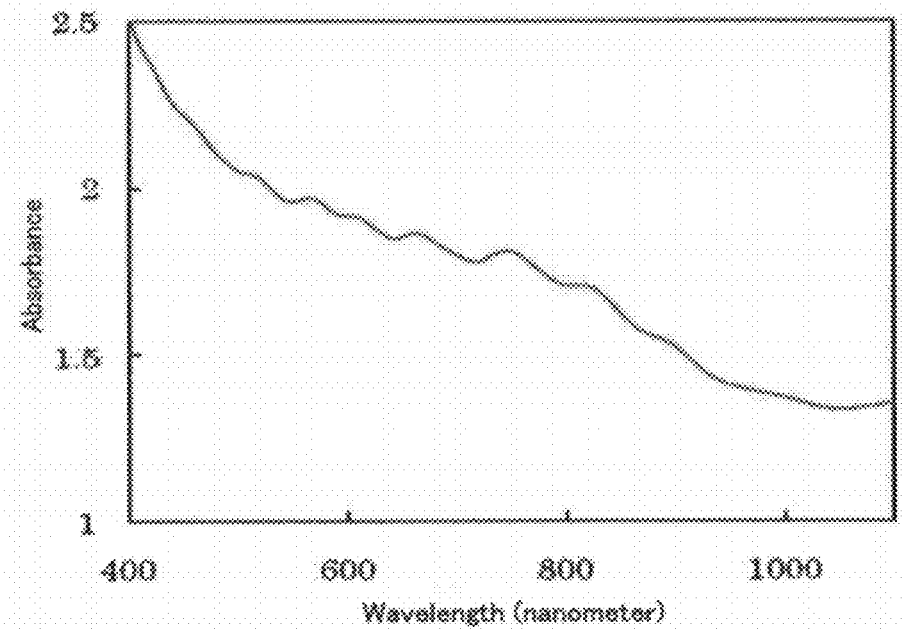
FIG. 3 is an absorption spectrum showing that carbon nanotubes in a gel obtained in Example 4 have high dispersibility.
Figure 4:
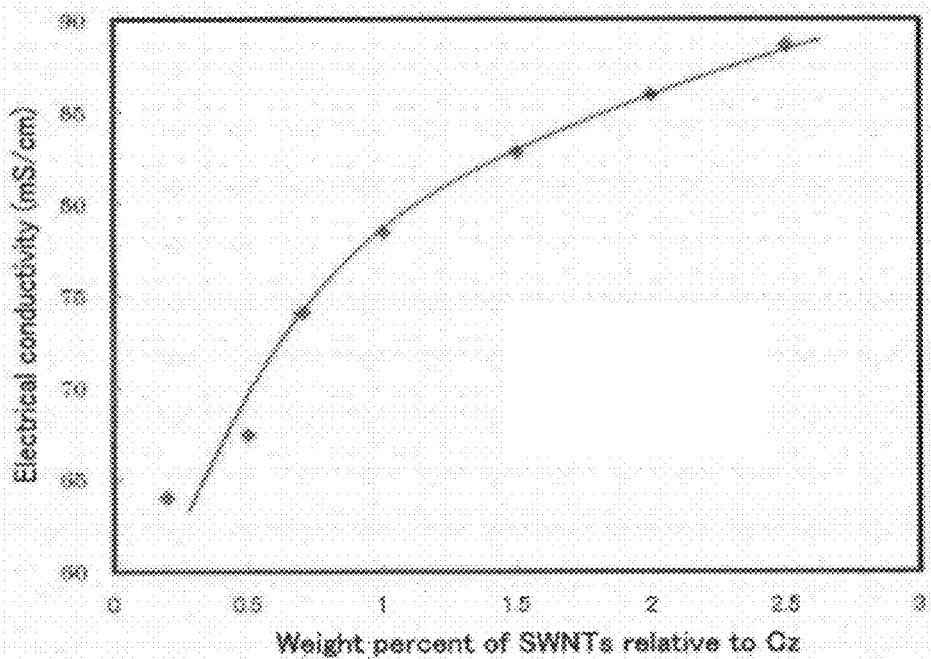
FIG. 4 is a graph showing the electrical conductivity of gels obtained in the same manner as in Example 4.

FIG. 2 shows a scanning electron microscope (SEM) image of a gel obtained in Example 4. As is obvious from FIG. 2, carbon nanotubes form a three-dimensional network in the gel. Further, FIG. 3 shows an absorption spectrum of the gel obtained in Example 4. As is obvious from FIG. 3, fine undulations are observed in a wavelength range of 500 nm to 900 nm, showing that the dispersibility of carbon nanotubes in the gel is high (no undulation is observed when carbon nanotubes aggregate). Further, gels obtained in the same manner as in Example 4 using seven different amounts of carbon nanotubes were each placed on a commercially available interdigitated electrode. The voltage was swept from −0.1 V to +0.1 V using an electrochemical analyzer, and the current value (A) then was measured to analyze the electrical resistance. The electrical conductivity of each gel was thus calculated. The results are shown in FIG. 4. As is obvious from FIG. 4, the electrical conductivity of a gel does not increase in simple proportion to the content of carbon nanotubes, but shows a saturation curve. This indicates that the electrical conductivity of a gel depends on the degree of formation of a three-dimensional network of carbon nanotubes. Further, a gel obtained in the same manner as in Example 4 using carbon nanotubes in an amount of 1 wt % was placed on a commercially available interdigitated electrode, and pressed with a cover glass from above to a thickness of 0.1 µm. At a bias voltage of 10 mV, photoirradiation was performed using a 500 W xenon lamp equipped with an IR-cut filter and a sharp-cut filter (transmission wavelength>480 nm), and the photocurrent was measured. The results are shown in FIG. 5. As is obvious from FIG. 5, the gel has a photoelectric conversion function, and thus is applicable as an optoelectronic device element or the like.

Example 11

The same operation as in Example 8 was performed, except that lead of a commercially available pencil containing about 30 wt % graphite was finely pulverized in an agate mortar with a pestle, and added in an amount of 65 wt % relative to 2-methylquinone. As a result, when the addition was completed, the contents had gelled (the contents were identified as a gel in the same manner as in Example 1).

INDUSTRIAL APPLICABILITY

The present invention makes it possible to provide a method for producing a gel containing a nano-carbon material, which allows the gelling medium used to be selected from a wide range of substances, is applicable to other nano-carbon materials in addition to carbon nanotubes, and can be implemented in an extremely simple manner. In this respect, the present invention is industrially applicable.

The invention claimed is:

1. A method for producing a gel containing a nano-carbon material, wherein the nano-carbon material is stir-mixed with a gelling medium that satisfies the following conditions, the gelling medium being in a liquid or molten state:
    (1) the gelling medium is in a liquid state at ambient temperature or melts when heated; and
    (2) the molecular structure of the gelling medium contains two or more rings of at least one kind selected from optionally substituted aromatic hydrocarbon monocyclic ring and optionally substituted aromatic heteromonocyclic ring,
    the method comprising the steps of:
    preparing the gelling medium in a liquid state or molten state;
    while the gelling medium is in the liquid state or molten state, adding the nano-carbon material to the gelling medium in the liquid state or molten state; and
    agitating the gelling medium in the liquid state or molten state and the nano-carbon material,
    wherein the gelling medium does not include a solvent, and wherein the gelling medium is not an ionic liquid.

2. A method according to claim 1, wherein the nano-carbon material is carbon nanotubes.

3. A method according to claim 1, wherein the molecular structure of the gelling medium contains at least one hetero atom in the molecule.

4. A method according to claim 1, wherein while the step of the nano-carbon material is being added to the gelling medium in the liquid state or molten state, the gelling medium in the liquid state or molten state is agitated.

5. A method according to claim 1, wherein while the step of the nano-carbon material is being added to the gelling medium in the liquid state or molten state, the gelling medium in the liquid state or molten state is not agitated.

6. A gel containing a nano-carbon material, wherein the gel is produced by stir-mixing a nano-carbon material with a gelling medium that has the following characteristics, the gelling medium being in a liquid or molten state:
    (1) the gelling medium is in a liquid state at ambient temperature or melts when heated; and
    (2) the molecular structure of the gelling medium contains two or more rings of at least one kind selected from optionally substituted aromatic hydrocarbon monocyclic ring and optionally substituted aromatic heteromonocyclic ring,
    the method comprising the steps of:
    preparing the gelling medium in a liquid state or molten state;
    while the gelling medium is in the liquid state or molten state, adding the nano-carbon material to the gelling medium in the liquid state or molten state; and
    agitating the gelling medium in the liquid state or the molten state and the nano-carbon material,
    wherein the gelling medium does not include a solvent, and wherein the gelling medium is not an ionic liquid.

7. A gel according to claim 6, wherein while the step of the nano-carbon material is being added to the gelling medium in the liquid state or molten state, the gelling medium in the liquid state or molten state is agitated.

8. A gel according to claim 6, wherein while the step of the nano-carbon material is being added to the gelling medium in the liquid state or molten state, the gelling medium in the liquid state or molten state is not agitated.

* * * * *